(12) United States Patent
Morrow et al.

(10) Patent No.: US 10,797,139 B2
(45) Date of Patent: Oct. 6, 2020

(54) METHODS OF FORMING BACKSIDE SELF-ALIGNED VIAS AND STRUCTURES FORMED THEREBY

(71) Applicant: Intel Corporation, Santa Clara, CA (US)

(72) Inventors: Patrick Morrow, Portland, OR (US); Mauro J. Kobrinsky, Portland, OR (US); Kimin Jun, Portland, OR (US); Il-Seok Son, Portland, OR (US); Paul B. Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/457,728

(22) Filed: Jun. 28, 2019

(65) Prior Publication Data

US 2019/0326405 A1 Oct. 24, 2019

Related U.S. Application Data

(63) Continuation of application No. 15/754,804, filed as application No. PCT/US2015/052033 on Sep. 24, 2015, now Pat. No. 10,367,070.

(51) Int. Cl.
*H01L 21/00* (2006.01)
*H01L 23/522* (2006.01)
(Continued)

(52) U.S. Cl.
CPC .. *H01L 29/41791* (2013.01); *H01L 21/02532* (2013.01); *H01L 21/76897* (2013.01);
(Continued)

(58) Field of Classification Search
CPC ..... H01L 21/823418; H01L 21/823475; H01L 21/845; H01L 21/02532; H01L 21/76897;
(Continued)

(56) References Cited

U.S. PATENT DOCUMENTS 5,869,867 A 2/1999 Takeuchi
6,455,398 B1 9/2002 Fonstad et al.
(Continued)

FOREIGN PATENT DOCUMENTS

CN 1309077 4/2007
CN 105448998 3/2016
(Continued)

OTHER PUBLICATIONS

International Preliminary Report on Patentability dated Apr. 5, 2019 for International Patent Application No. PCT/US2015/052033.
(Continued)

*Primary Examiner* — Nikolay K Yushin
(74) *Attorney, Agent, or Firm* — Green, Howard & Mughal LLP

(57) ABSTRACT

Methods and structures formed thereby are described, of forming self-aligned contact structures for microelectronic devices. An embodiment includes forming a trench in a source/drain region of a transistor device disposed in a device layer, wherein the device layer is on a substrate, forming a fill material in the trench, forming a source/drain material on the fill material, forming a first source/drain contact on a first side of the source/drain material, and then forming a second source drain contact on a second side of the source/drain material.

20 Claims, 12 Drawing Sheets

(51) Int. Cl.
| | |
|---|---|
| *H01L 27/00* | (2006.01) |
| *H01L 29/00* | (2006.01) |
| *H01L 29/417* | (2006.01) |
| *H01L 21/84* | (2006.01) |
| *H01L 27/12* | (2006.01) |
| *H01L 21/02* | (2006.01) |
| *H01L 21/768* | (2006.01) |
| *H01L 21/8234* | (2006.01) |
| *H01L 23/528* | (2006.01) |
| *H01L 27/088* | (2006.01) |
| *H01L 29/08* | (2006.01) |
| *H01L 29/10* | (2006.01) |
| *H01L 29/165* | (2006.01) |
| *H01L 29/66* | (2006.01) |
| *H01L 29/78* | (2006.01) |
| H01L 21/265 | (2006.01) |
| H01L 21/306 | (2006.01) |
| H01L 21/324 | (2006.01) |

(52) U.S. Cl.
CPC ........ *H01L 21/823418* (2013.01); *H01L 21/823431* (2013.01); *H01L 21/823475* (2013.01); *H01L 21/845* (2013.01); *H01L 23/528* (2013.01); *H01L 23/5226* (2013.01); *H01L 27/0886* (2013.01); *H01L 27/1211* (2013.01); *H01L 29/0847* (2013.01); *H01L 29/1037* (2013.01); *H01L 29/165* (2013.01); *H01L 29/41775* (2013.01); *H01L 29/66636* (2013.01); *H01L 29/66795* (2013.01); *H01L 29/7848* (2013.01); *H01L 29/7851* (2013.01); *H01L 21/02529* (2013.01); *H01L 21/26513* (2013.01); *H01L 21/30604* (2013.01); *H01L 21/324* (2013.01); *H01L 29/6656* (2013.01)

(58) Field of Classification Search
CPC ......... H01L 21/823431; H01L 21/324; H01L 21/02529; H01L 21/26513; H01L 21/30604; H01L 23/528; H01L 23/5226; H01L 23/58; H01L 23/4855; H01L 27/1211; H01L 27/0886; H01L 27/10826; H01L 27/088; H01L 29/66636; H01L 29/41775; H01L 29/1037; H01L 29/7848; H01L 29/66795; H01L 29/165; H01L 29/0847; H01L 29/7851; H01L 29/785; H01L 29/41791; H01L 29/6656
See application file for complete search history.

(56) References Cited

U.S. PATENT DOCUMENTS

| | | |
|---|---|---|
| 7,091,534 B2 | 8/2006 | Koyanagi |
| 7,402,866 B2 | 7/2008 | Liang et al. |
| 8,084,795 B2 | 12/2011 | Pan |
| 8,354,675 B2 | 1/2013 | Kwon et al. |
| 8,395,191 B2 | 3/2013 | Or-Bach et al. |
| 8,426,888 B2 | 4/2013 | Molin |
| 9,171,887 B2 | 10/2015 | Yokoyama |
| 9,385,195 B1 | 7/2016 | Zhang |
| 9,412,788 B2 | 8/2016 | Yokoyama et al. |
| 9,450,075 B2 | 9/2016 | Huang |
| 9,640,531 B1 | 5/2017 | Or-Bach et al. |
| 9,818,856 B2 | 11/2017 | Hoshi et al. |
| 9,929,133 B2 | 3/2018 | Lin et al. |
| 10,420,171 B2 | 9/2019 | Goktepeli |
| 2006/0115943 A1 | 6/2006 | Koyanagi |
| 2007/0001219 A1 | 1/2007 | Radosavljevic et al. |
| 2007/0296002 A1 | 12/2007 | Liang et al. |
| 2008/0179678 A1 | 7/2008 | Dyer et al. |
| 2009/0152611 A1 | 6/2009 | Fujimoto |
| 2009/0166677 A1 | 7/2009 | Shibata et al. |
| 2011/0241073 A1 | 10/2011 | Cohen et al. |
| 2012/0043663 A1 | 2/2012 | Ko et al. |
| 2012/0088339 A1 | 4/2012 | Molin et al. |
| 2013/0130479 A1 | 5/2013 | Stuber et al. |
| 2014/0054685 A1 | 2/2014 | Consentino et al. |
| 2014/0210058 A1 | 7/2014 | Lee et al. |
| 2014/0231874 A1 | 8/2014 | Hoshi et al. |
| 2014/0264632 A1 | 9/2014 | Richter et al. |
| 2014/0332749 A1 | 11/2014 | Yokoyama |
| 2015/0028289 A1 | 1/2015 | Hekmatshoartabari |
| 2015/0061020 A1 | 3/2015 | Yokoyama et al. |
| 2015/0061026 A1 | 3/2015 | Lin et al. |
| 2015/0069520 A1 | 3/2015 | Lee |
| 2015/0137224 A1 | 5/2015 | Meiser et al. |
| 2015/0206936 A1 | 7/2015 | Huang |
| 2015/0235949 A1 | 8/2015 | Yu et al. |
| 2015/0357425 A1 | 12/2015 | Liu et al. |
| 2015/0380305 A1 | 12/2015 | Basker et al. |
| 2016/0095221 A1 | 3/2016 | Ramachandran et al. |
| 2016/0247887 A1 | 8/2016 | Jun et al. |
| 2019/0057959 A1 | 2/2019 | Or-Bach et al. |

FOREIGN PATENT DOCUMENTS

| | | |
|---|---|---|
| JP | H09260669 | 3/1997 |
| JP | 2014220376 | 11/2014 |
| KR | 1020100106702 | 10/2010 |
| WO | 2017052562 | 3/2017 |
| WO | 2017052626 | 3/2017 |
| WO | 2017095409 | 6/2017 |
| WO | 2018031175 | 2/2018 |

OTHER PUBLICATIONS

International Search Report & Written Opinion dated Jun. 13, 2016 for PCT Patent Application No. PCT/US2015/052033.
Non-Final Office Action dated Oct. 22, 2018 for U.S. Appl. No. 15/754,804.
Notice of Allowance dated Mar. 20, 2019 for U.S. Appl. No. 15/754,804.
Office Action & Search Report dated Oct. 23, 2019 for Taiwan Patent Application No. 105125329.

10,797,139 B2

METHODS OF FORMING BACKSIDE SELF-ALIGNED VIAS AND STRUCTURES FORMED THEREBY

CLAIM FOR PRIORITY

This Application is a Continuation of U.S. patent application Ser. No. 15/754,804, filed Feb. 23, 2018, titled, "METHODS OF FORMING BACKSIDE SELF-ALIGNED VIAS AND STRUCTURES FORMED THEREBY", now U.S. patent Ser. No. 10/367,070, which is a National Stage Entry of, and claims priority to, PCT Patent Application No. PCT/US2015/052033, filed on Sep. 24, 2015 and titled "METHODS OF FORMING BACKSIDE SELF-ALIGNED VIAS AND STRUCTURES FORMED THEREBY", which is incorporated by reference in its entirety for all purposes.

BACKGROUND OF THE INVENTION

Microelectronic devices, such as monolithic integrated circuits (ICs), for example, may include a number of transistors, such as metal oxide semiconductor field effect transistors (MOSFETs) fabricated over a substrate, such as a silicon wafer. As device sizes continue to decrease, stacking of devices in a third dimension, typically referred to as vertical scaling, or three-dimensional (3D) integration, becomes a promising path toward greater device density.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1:
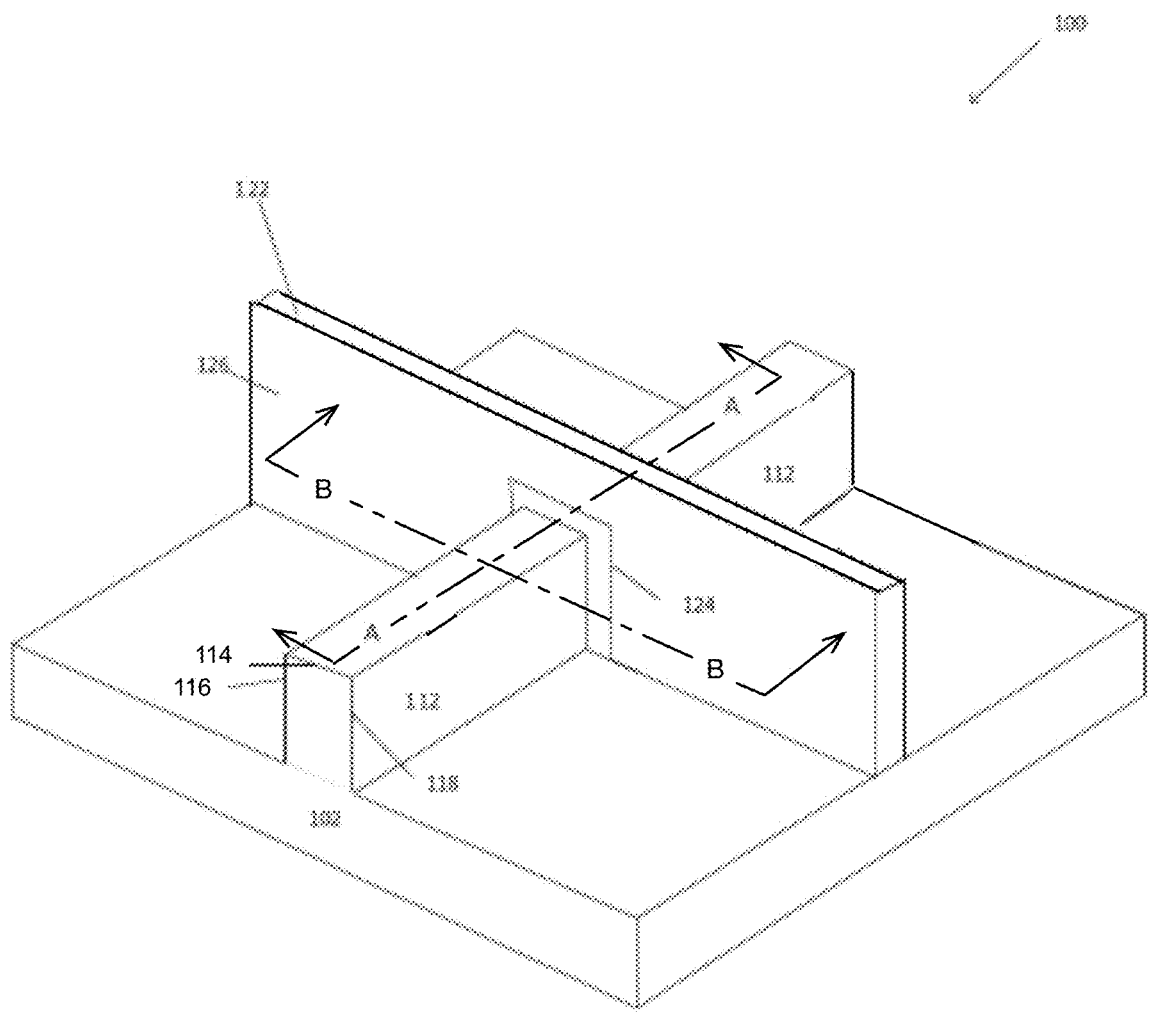
FIG. 1 represents a perspective view of a structure according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Implementations of the embodiments herein may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope.

A plurality of transistors, such as metal-oxide-semiconductor field-effect transistors (MOSFET or simply MOS transistors), may be fabricated on the substrate such as in device layers as will be noted herein. In various implementations, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate non-planar transistors, it should be noted that embodiments may also be carried out using any other suitable type of transistor architecture.

Each transistor may include a gate stack formed of at least two layers, for example, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations, the gate electrode may consist of a combination of U-shaped structures and planar, non-U-shaped structures. For example, the gate electrode may consist of one or more U-shaped metal layers formed atop one or more planar, non-U-shaped layers.

In some implementations, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers may include deposition and etching process steps. In an alternate implementation, a plurality of spacer pairs may be used, for instance, two pairs, three pairs, or four pairs of sidewall spacers may be formed on opposing sides of the gate stack.

Source and drain regions may be formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process.

In an embodiment, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Methods and associated structures of forming microelectronic device structures, such as self-aligned via structures, are presented. Those methods/structures may include forming a trench in a source/drain region of a transistor device disposed in a device layer, wherein the device layer is on a substrate, forming a fill material in the trench, forming a source/drain material on the fill material, forming a first source/drain contact on a first side of the source/drain material, and then forming a second source drain contact on a second side of the source/drain material. The self-aligned vias/contacts of the embodiments herein provide interconnect structures for both above and below a device layer, within the footprint of the device. Although embodiments herein depict examples of a non-planar device, the methods and structures herein may include any type of transistor/device, such as a planar, trigate, fin-fet, omega gate, gate all around device structures, and may comprise silicon or any other type of materials, such as III-V materials, for example.

FIG. 1 is a perspective view of a non-planar transistor 100, including at least one gate formed on at least one transistor fin, which are formed on a microelectronic substrate 102. In an embodiment, the microelectronic substrate 102 may be a monocrystalline silicon substrate. The microelectronic substrate 102 may also be other types of substrates, such as silicon-on-insulator ("SOI"), germanium, gallium arsenide, indium antimonide, lead telluride, indium arsenide, indium phosphide, gallium arsenide, gallium antimonide, and the like, any of which may be combined with silicon.

The non-planar transistor, shown as a tri-gate transistor, may include at least one non-planar transistor fin 112. The non-planar transistor fin 112 may have a top surface 114 and a pair of laterally opposite sidewalls, sidewall 116 and opposing sidewall 118, respectively.

As further shown in FIG. 1, at least one non-planar transistor gate 122 may be formed over the non-planar transistor fin 112. The non-planar transistor gate 122 may be fabricated by forming a gate dielectric layer 124 on or adjacent to the non-planar transistor fin top surface 114 and on or adjacent to the non-planar transistor fin sidewall 116 and the opposing non-planar transistor fin sidewall 118. A gate electrode 126 may be formed on or adjacent the gate dielectric layer 124. In one embodiment of the present disclosure, the non-planar transistor fin 112 may run in a direction substantially perpendicular to the non-planar transistor gate 122.

The gate dielectric layer 124 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer 124 can be formed by well-known techniques, such as by conformally depositing a gate dielectric material and then patterning the gate dielectric material with well-known photolithography and etching techniques, as will be understood to those skilled in the art.

The gate electrode 126 may be formed by various methods, according to the particular application. A source region and a drain region (not shown in FIG. 1) may be formed in the non-planar transistor fin 112 on opposite sides of the gate electrode 126. In one embodiment, the source and drain regions may be formed by doping the non-planar transistor fins 112, as will be understood to those skilled in the art. In another embodiment, the source and drain regions may be formed by removing portions of the non-planar transistor fins 112 and replacing these portions with appropriate material(s) to form the source and drain regions, as will be understood to those skilled in the art. In still another embodiment, the source and drain regions may be formed by exitaxially growing doped or undoped strain layers on the fins 112. Other methods or combination of methods, may be utilized to form the source/drain regions, according to the particular application.

Figure 2A:
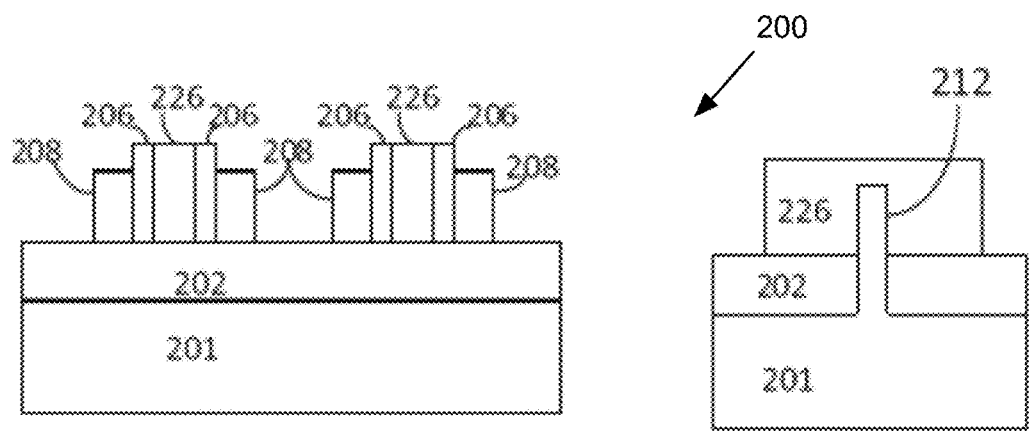
FIGS. 2*a*-2*p* represent side cross sectional views of structures according to embodiments
Figure 2B:
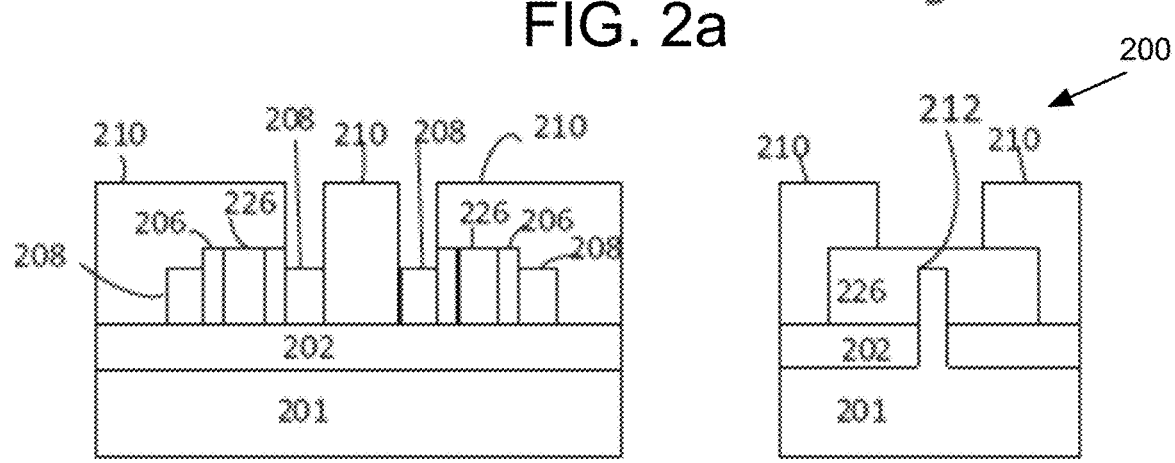
Figure 2C:
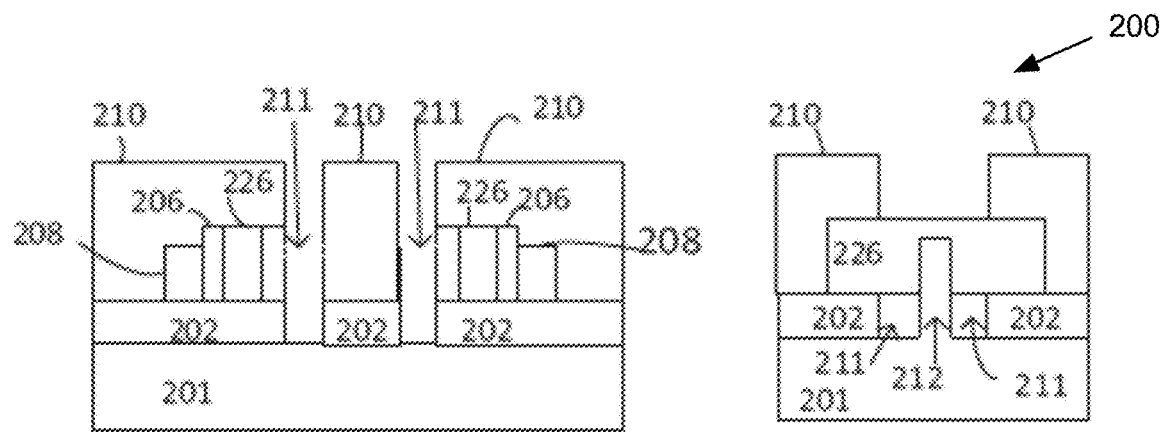
Figure 2D:
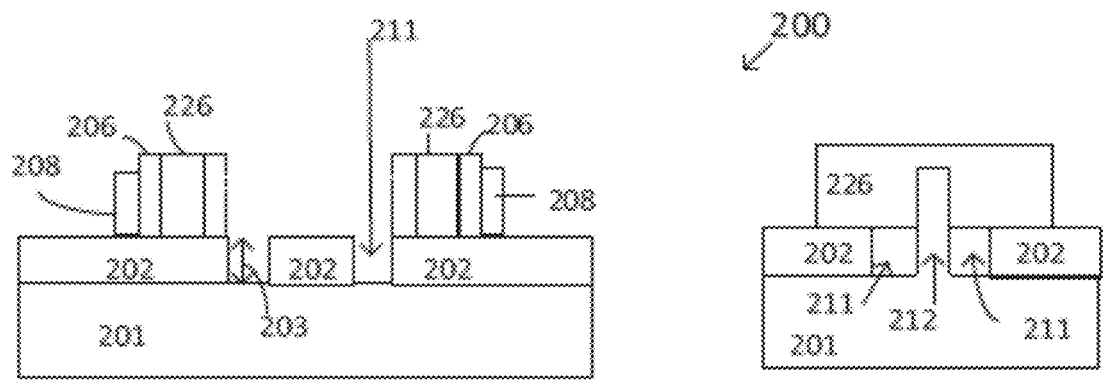
Figure 2E:
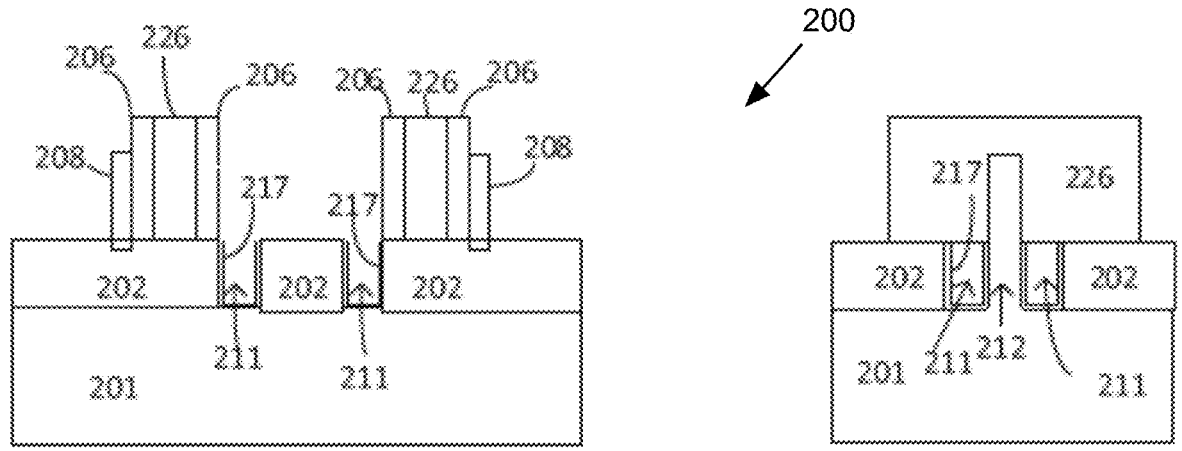
Figure 2F:
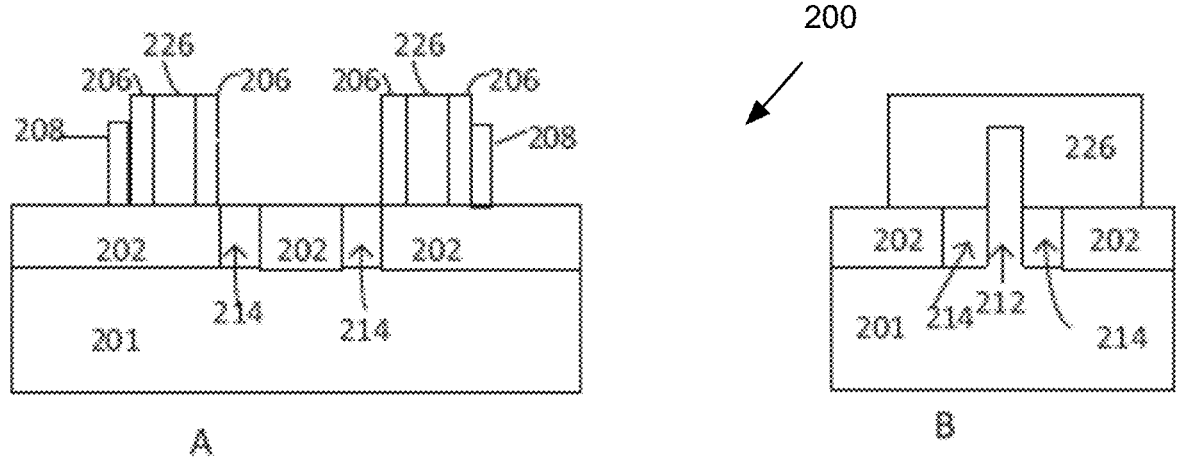
Figure 2G:
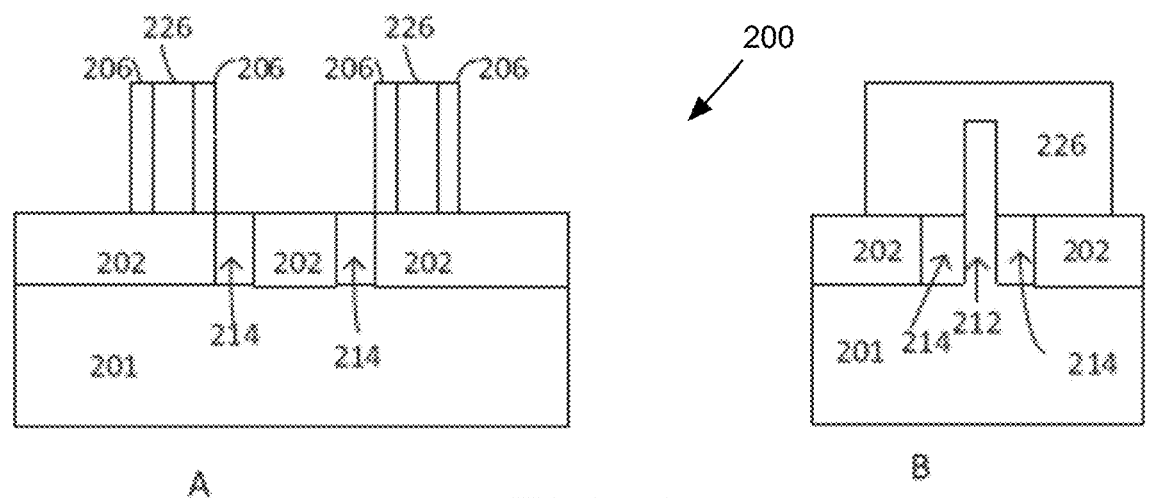
Figure 2H:
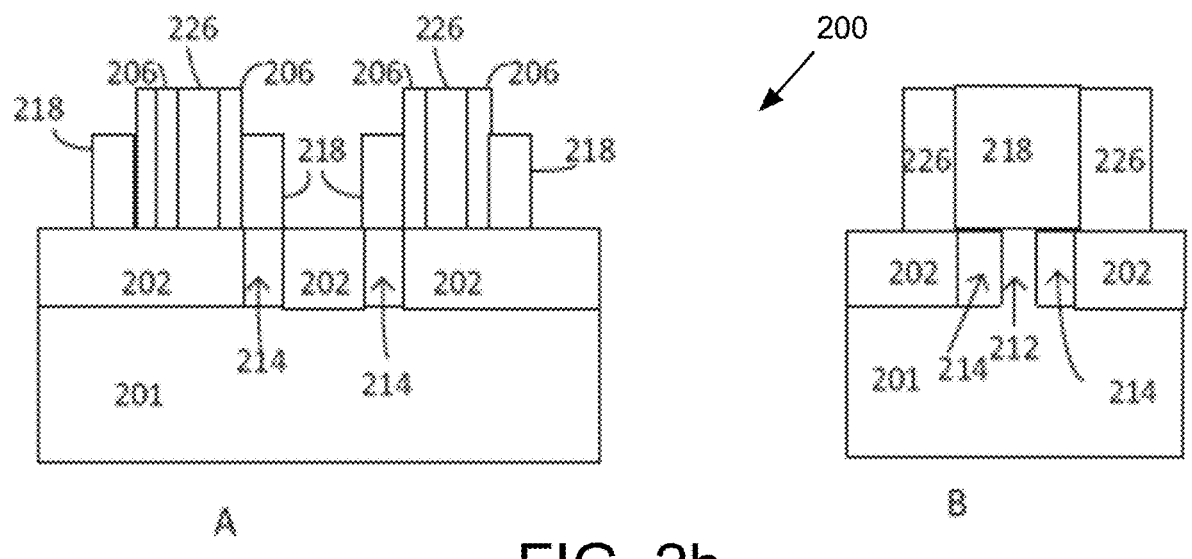
Figure 2I:
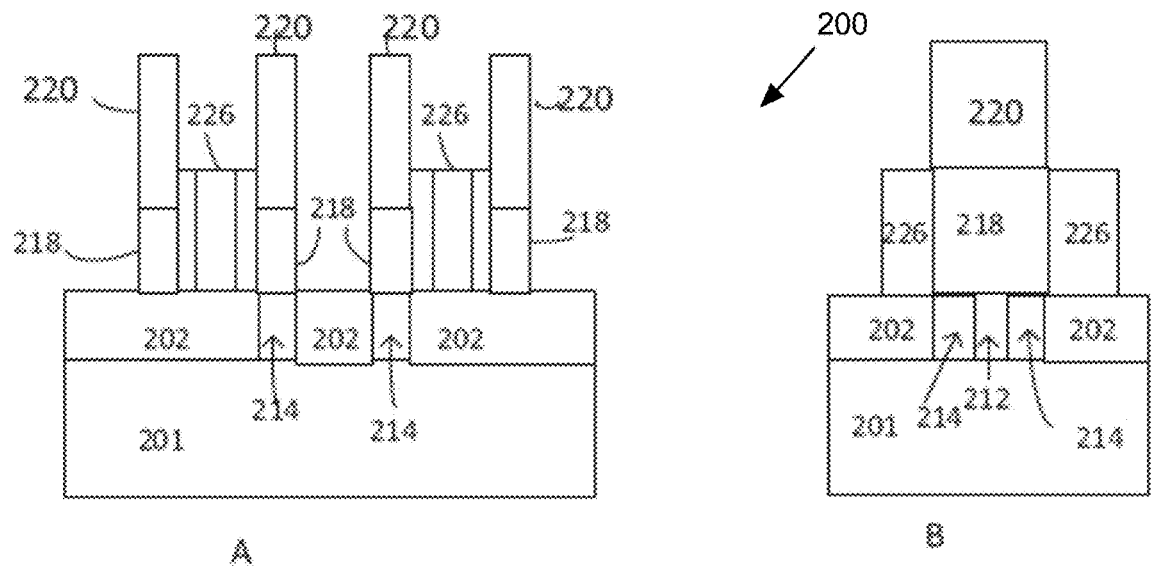
Figure 2J:
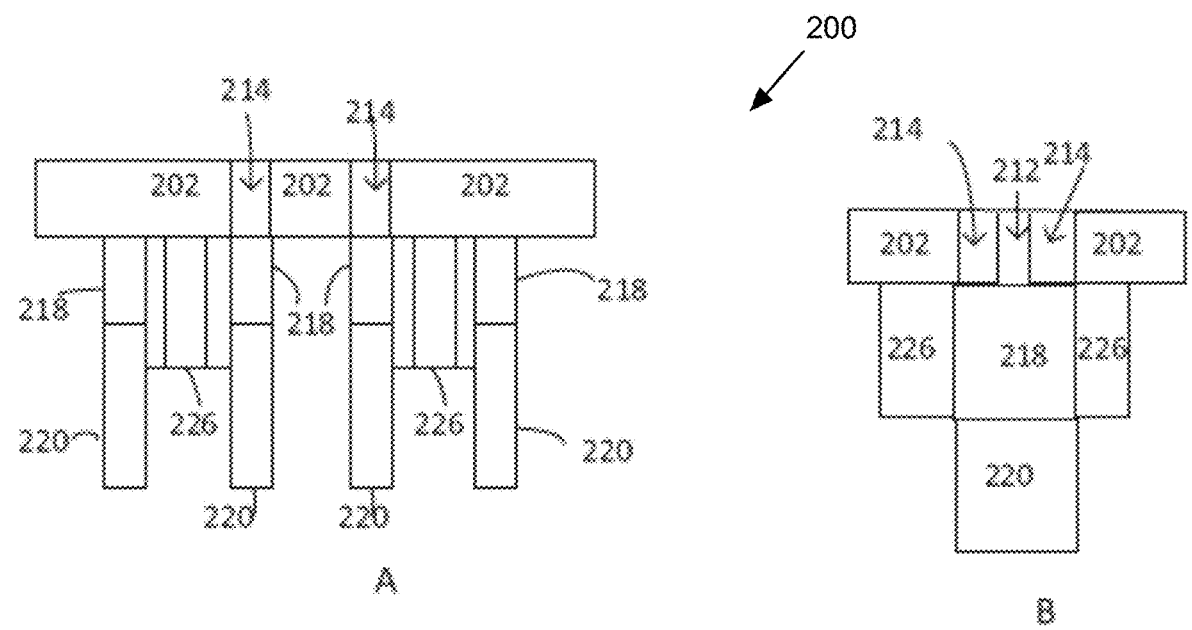
Figure 2K:
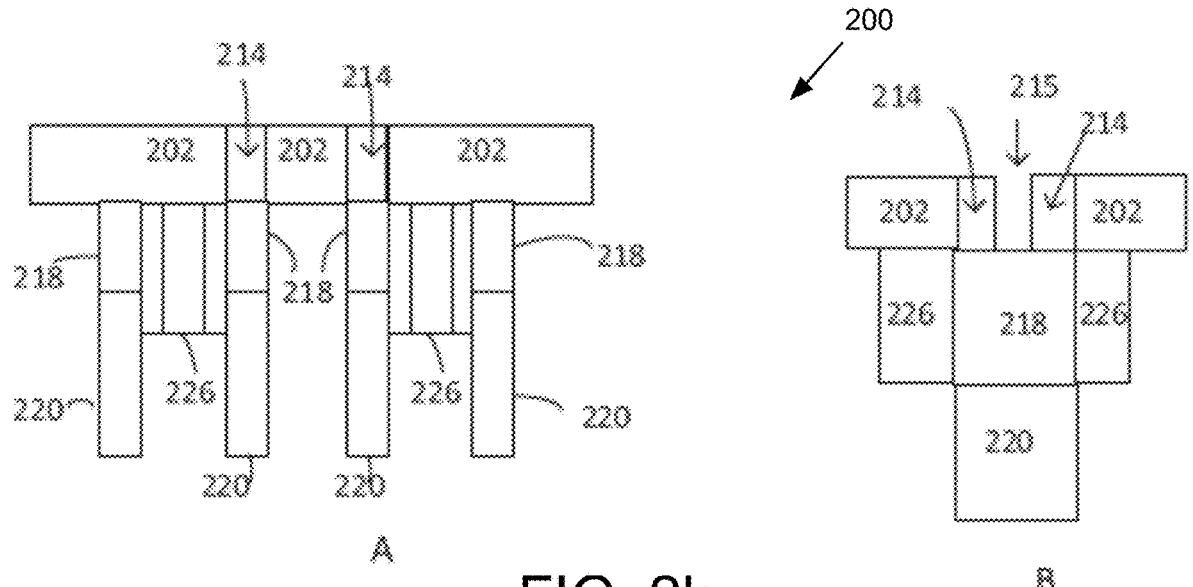
Figure 2L:
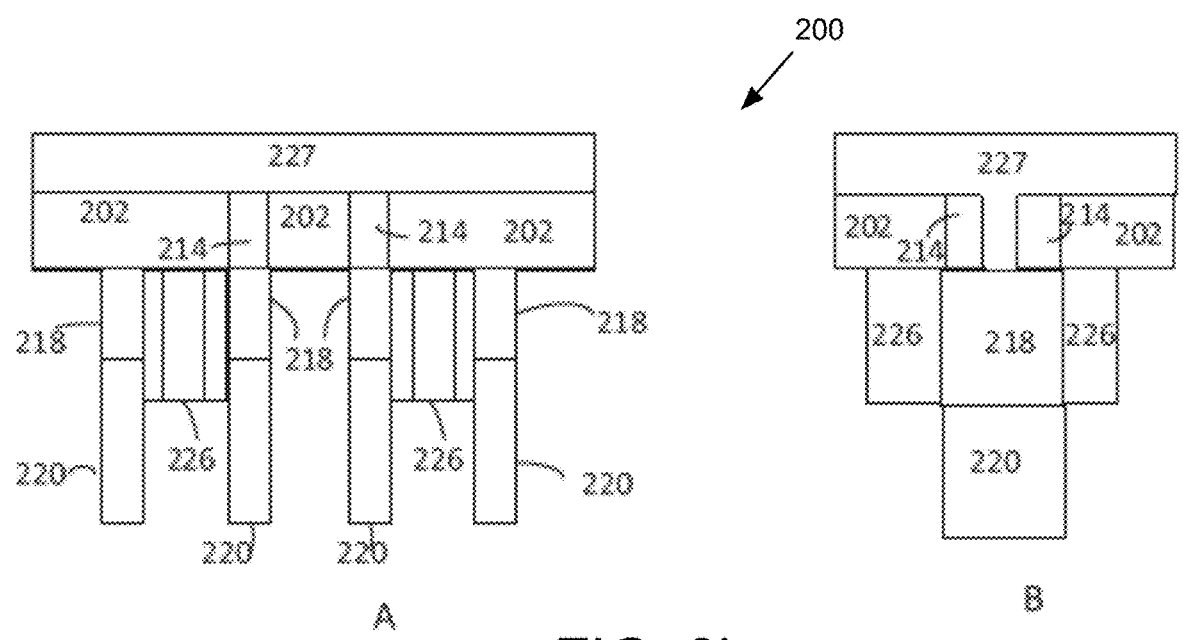
Figure 2M:
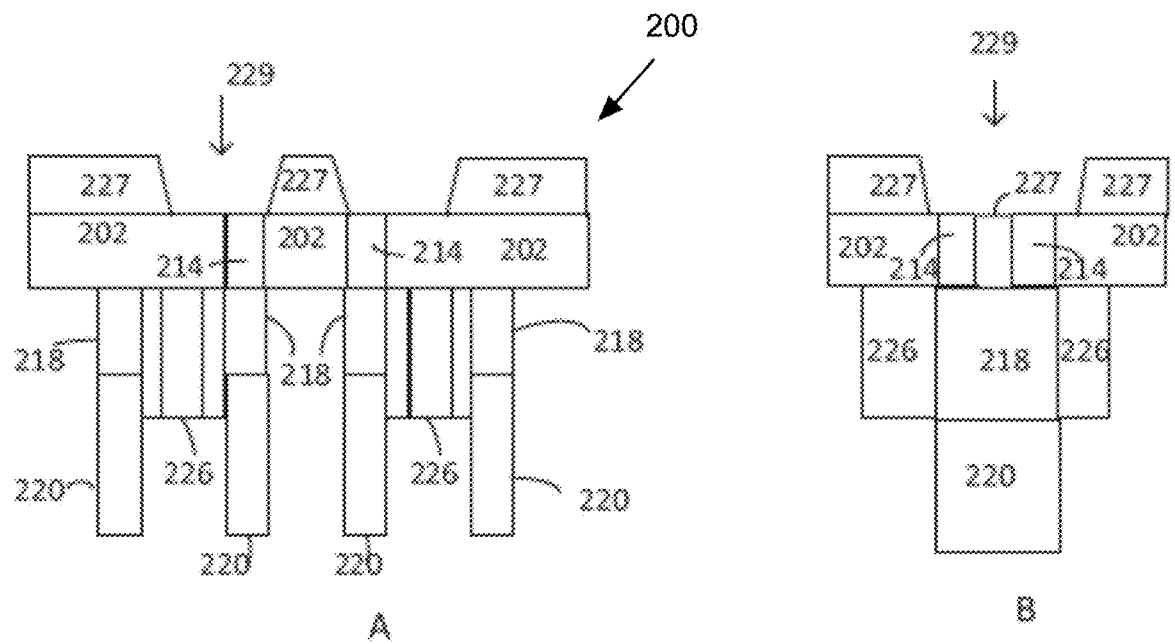
Figure 2N:
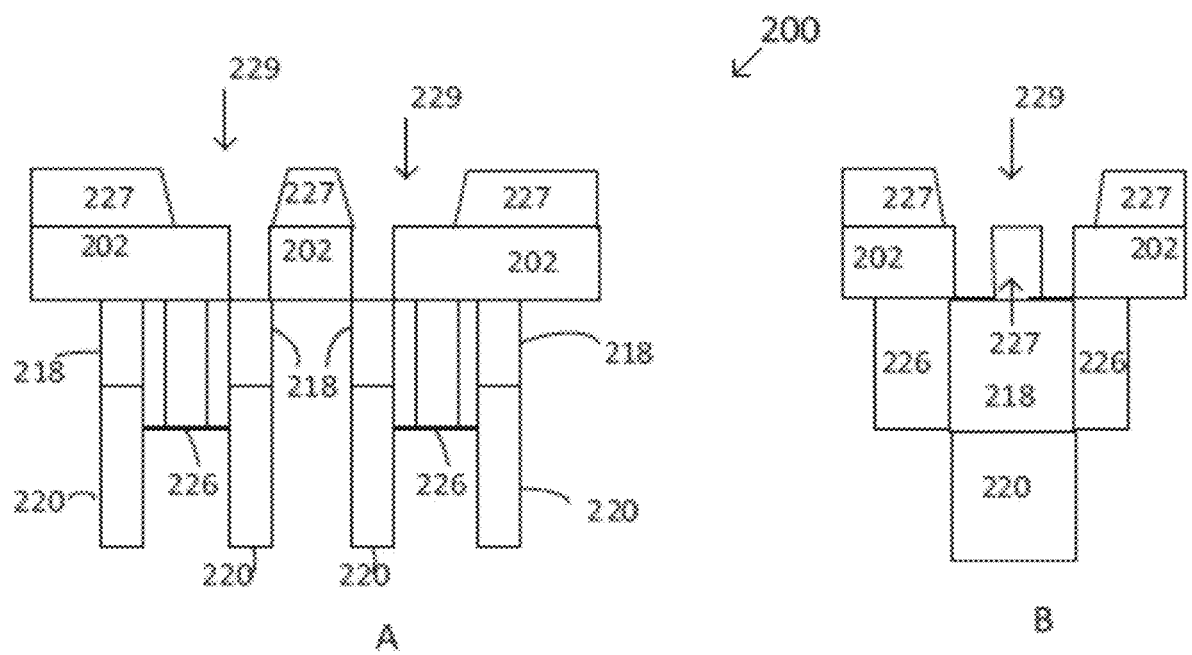
Figure 2O:
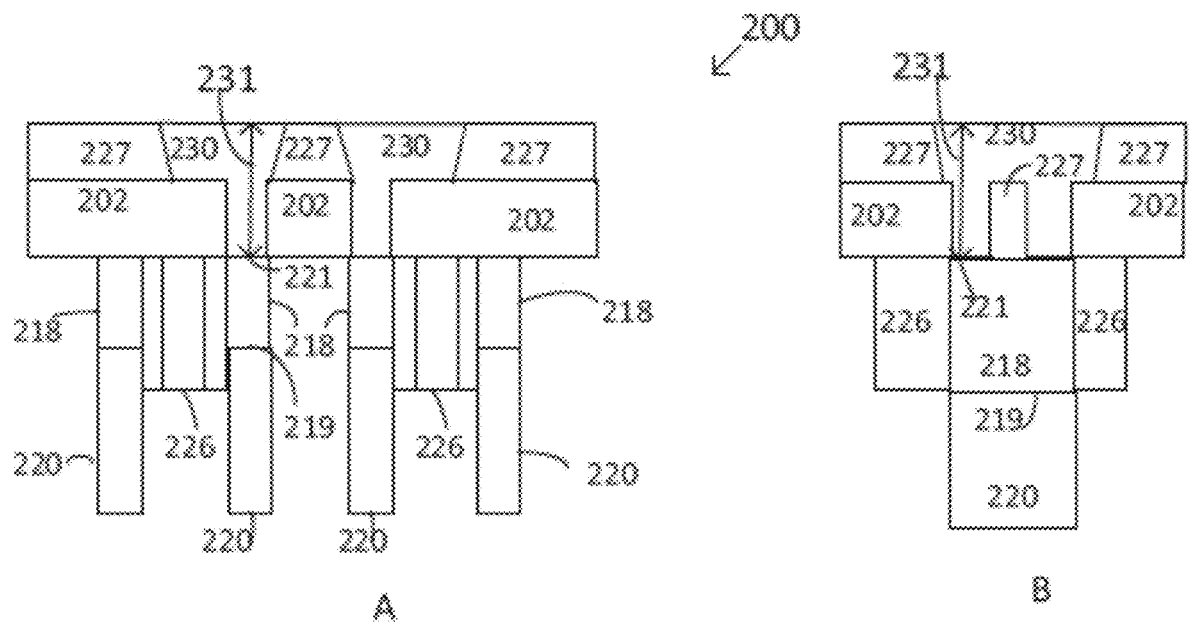
Figure 2P:
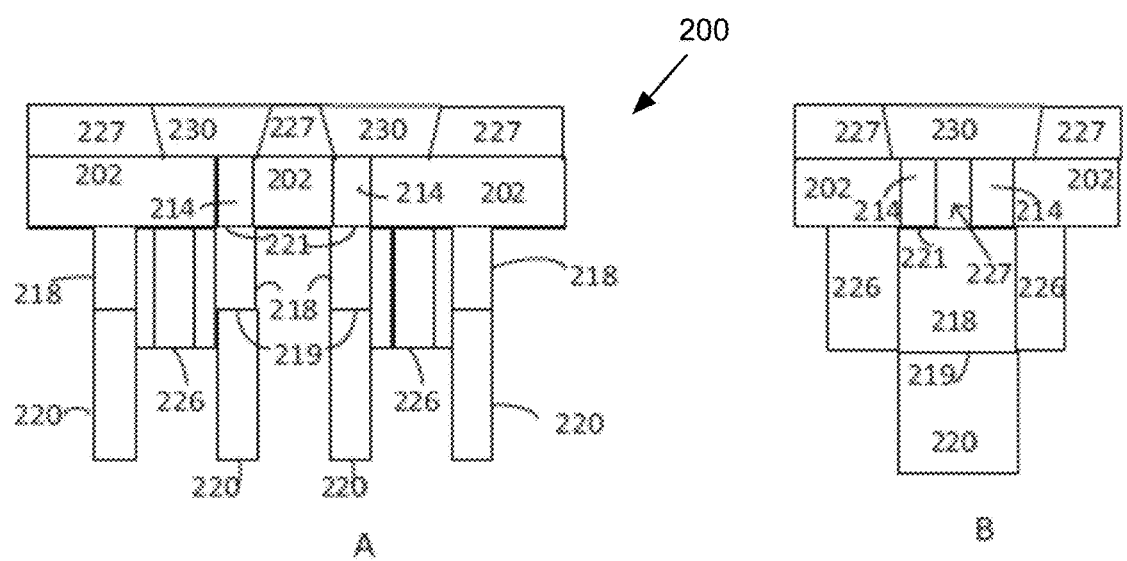

In FIGS. 2a-2p, side cross sectional views of structures and methods of forming self-aligned vias are depicted. FIGS. 2a-2p depict cross sectional views along arrows A-A and B-B of a non-planar device, such as the non-planar device of FIG. 1. In FIG. 2a, a portion of a device 200, such as a transistor device, is depicted. The device 200 may comprise a substrate 201, in an embodiment, which may further comprise a portion of a silicon fin 203. A layer 202 may be disposed on the substrate 200, wherein the layer 202 may comprise a dielectric layer/material, but in other embodiments it may comprise a silicon material. A gate electrode 226 may be disposed on the layer 202, and may comprise a gate electrode material. The gate electrode 226 may further comprise a gate dielectric material (not shown), disposed between the gate electrode 226 and the layer 202, as well as between a silicon fin 212 and the gate electrode 226. In an embodiment, a pair of gate spacers 206 may be disposed on either side of the gate electrode 226. The view through B depicts the fin 212 portion of the substrate 200, wherein the gate 226 is disposed on the silicon fin 212 portion of the substrate 200. Source/drain regions 208 are adjacent the gate spacers 206 in an embodiment, but in other embodiments, there may be no gate spacers 206 adjacent the gate 226, so that the source/drain regions may be adjacent the gate electrode 226, without the intervening gate spacers 206.

In FIGS. 2b-2c, a mask material 210 may be formed on the gate electrode 226 and on the fin 201 of the device 200, to define an opening 211 in the source drain regions 208. Any type of process, such as an etching process, may be utilized to form a deep trench opening 211 in the source/drain regions 208. The mask material 210 may be removed, and the trench opening 211, which may comprise a source/drain contact opening 211, may comprise a depth 203 of between about 20 nanometers and about 500 nanometers, in an embodiment (FIG. 2d). In an optional embodiment, the trench 211 may be lined with a liner material 217, along a sidewall of the trench 211, in an embodiment (FIG. 2e). In an embodiment, the liner 217 (it may comprise an insulating material, such as an alumina, silicon nitride, silicon carbide, material, for example. In an embodiment, the trench 211 may not be lined with the liner material 217.

In an embodiment, a fill material 214 may be formed within and/or may fill the trench 211 (FIG. 2f). In an embodiment, the fill material 214 may be formed within the trench 211 by using a multi-step process, wherein the high aspect trench opening may be filled uniformly. In an embodiment, the fill material 214 may comprise a temporary material, such as a titanium containing material, such as titanium nitride, titanium oxide. In another embodiment, the fill material 214 may comprise a conductive material such as titanium, cobalt, tungsten, copper, or combinations thereof, and the like. In an embodiment, the fill material 214 may be a permanent portion of the device, and may be non-sacrificial. In an embodiment, the fill material 214 may be located below a typical source/drain trench depth, for example, the fill material 214 may completely or substantially extend through the layer 202. In an embodiment, the fill material 214 may be recessed with an etch process so that the fill material 214 may extend through the layer 202. In an embodiment, the fin 212 may be recessed and undercut/removed from the substrate 201 (FIG. 2g).

In an embodiment, source/drain material 218 may be formed on and/or in the source/drain regions (FIG. 2h). In an embodiment, the source drain material 218 may comprise an epitaxial material, such as a silicon germanium material, for example. In an embodiment, the source drain material 218 adjacent the gate electrode 226 may be on the material 214. In an embodiment, at least a portion of the source/drain material 218 may be directly on the material 214. In an embodiment, a source/drain contact 220 may be coupled with and/or formed on the source/drain material 218 (FIG. 2i). In an embodiment, the source/drain contact 220 may comprise a lower source/drain contact 220.

In an embodiment, a carrier wafer may be attached to the device 200 (not shown), and the substrate 201 may be reduced in depth and or removed, from the layer 202 (FIG. 2j). In an embodiment, a portion of the substrate 201 may be removed by utilizing a grinding, wet etch or CMP process for example. The mechanical base of the silicon fin 212 may be revealed/exposed, the fill material 214 may be exposed, and the back surface of the substrate 202 may be exposed. In an embodiment, the base of the silicon fin(s) 212 may be recessed, wherein an opening 215 is formed (FIG. 2k). The recess of the silicon fin 212 may reduce subfin leakage, in an embodiment. The recessed silicon fin regions may then be filled with a dielectric material 227, such as a silicon dioxide material for example, (FIG. 2l), and may be polished to smooth out the surface.

In an embodiment, the dielectric 227 may be patterned and etched to form source drain contact openings 229 (FIGS. 2m-2n). In an embodiment, the source/drain contact openings 229 may comprise deep openings, and may comprise a depth of about 20 nm to about 300 nm, in an embodiment. In an embodiment, the fill material 214 may be removed. However, in some embodiments, the fill material 214 may remain. In an embodiment, the source/drain openings 229 may be filled with a conductive material to form a source/drain contact 230 (FIG. 2o). In an embodiment, the source/drain contacts 230 may comprise self-aligned backside vias, and may comprise a height of about 40 nm to about 500 nm, in an embodiment. The source/drain contacts 230 (as well as the first source/drain contacts) may comprise conductive materials such as copper, tungsten, cobalt, and titanium, and may comprise an upper contact 230.

In an embodiment, a first side 219 of the source/drain material 218 may be in direct contact with the source/drain contact 220, and a second side 221 of the source/drain material 218 may be in direct contact with the source/drain contact 230. In another embodiment, the second side 221 of the source/drain material 218 may be in direct contact with a non-sacrificial fill material 214, and the non-sacrificial fill material 214 may be in direct contact with the contact 230 (FIG. 2p). The first side 219 of the source/drain material 218 may be in direct contact with the source/drain contact 220. In an embodiment, the gate electrode 226 may be adjacent to the source/drain contacts 220, 230, and may be directly adjacent in some embodiments. In an embodiment, the first source/drain contact and the second source/drain contact may comprise substantially different heights, and in another embodiment, the height of one of the first source/drain contacts is about twice the height of the other of the source/drain contacts.

The ability to route the electrical interconnects above and below a transistor layer provides novel routing and scaling options. Embodiments herein enable the ability to make electrical connections between interconnect layers above and below transistor layers without increasing the transistor footprint. The additional depth of the trench opening provides margin needed to connect to the other side of the device layer without electrically connecting the transistor channel region, in an embodiment. In an embodiment, self-aligned source drain contacts go through the source drain material and connect to an upper interconnect layer. The connection is within the footprint of the device.

Figure 3:
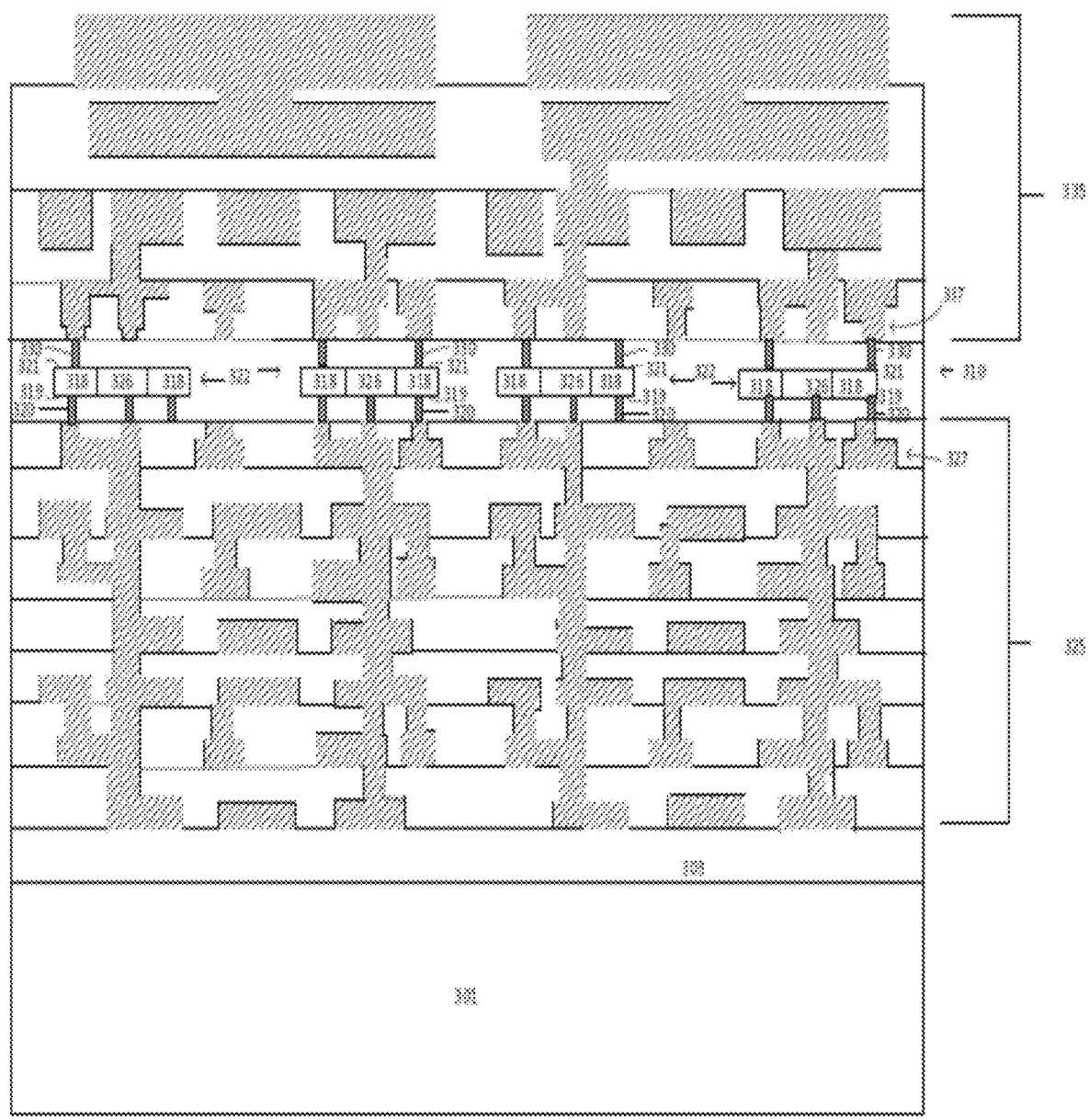
FIG. 3 represents a cross sectional view of a structure according to embodiments.

Referring to FIG. 3, in an embodiment, a device structure 300 may comprise a plurality of upper interconnect structures 335 and a plurality of lower interconnect structures 325. A device layer 310 may comprise a plurality of devices 322 that may be coupled to both the upper interconnect structures 335 and the lower interconnect structures 325, wherein the upper interconnect structures 335 are located above the device layer 310 and the lower interconnect structures 325 are located below the device layer 310. In one embodiment, devices 322 may comprise low power range, typically fast devices including logic devices such as Fin-FETs or other reduced form factor devices that can generally be arranged on a device layer at a higher pitch than higher voltage range devices. In an embodiment, a source/drain contact 320 may be coupled with a first side 319 of a source/drain region 318 of one of the devices 322, and a source/drain contact 330 may be coupled with a second side 321 of the source/drain region 318. The source/drain regions 318 may be adjacent a gate electrode 326. In an embodiment, the source/drain contacts 320, 330 may be directly coupled to the source/drain region 318 of the device 322, similar to the structure of FIG. 2o. In an embodiment, the devices 332 may comprise devices which do not comprise fin structures, such as planar transistor devices, or other types of device structures without a silicon fin. In an embodiment, the source/drain contacts 320, 330 may comprise a via structure (not shown) between them. In another embodiment, the source/drain contact 330 may be directly coupled with a fill material (not shown), similar to the structure of FIG. 2p. In an embodiment, the gate electrode 226 may be directly coupled to the source/drain region 318 of the device 322, similar to the structure of FIG. 2o. In an embodiment, the devices 332 may comprise devices which do not comprise fin structures, such as planar transistor devices, or other types of device structures without a silicon fin. In an embodiment, the source/drain contacts 320, 330 may comprise a via structure (not shown) between them. In another embodiment, the source/drain contact 330 may be directly coupled with a fill material (not shown), similar to the structure of FIG. 2p.

The upper and lower source/drain contacts 330, 320 are coupled with the upper and lower plurality of interconnects 325, 335, respectively. In an embodiment, the device 300 may comprise multi-layers of interconnects, such as a first layer of lower interconnects 327, and a first layer of upper interconnects 337, and so on. In an embodiment, a source drain region 318, may be disposed between the source/drain contact 320 and the source/drain contact 320, and may be directly in contact with both source/drain contacts, however in other embodiments there may be intervening layers between the source/drain contacts and the source/drain region 318.

In one embodiment, the upper and lower plurality of interconnects 325, 335 comprise a copper material and may be patterned as is known in the art. Source/drain contacts 320, 330 disposed between circuit devices may comprise such materials as tungsten or copper material. The plurality of upper and lower interconnects, as well as the source/drain contacts may be insulated from one another and from the devices by dielectric materials 303, such as with an oxide 303, for example.

Figure 4:
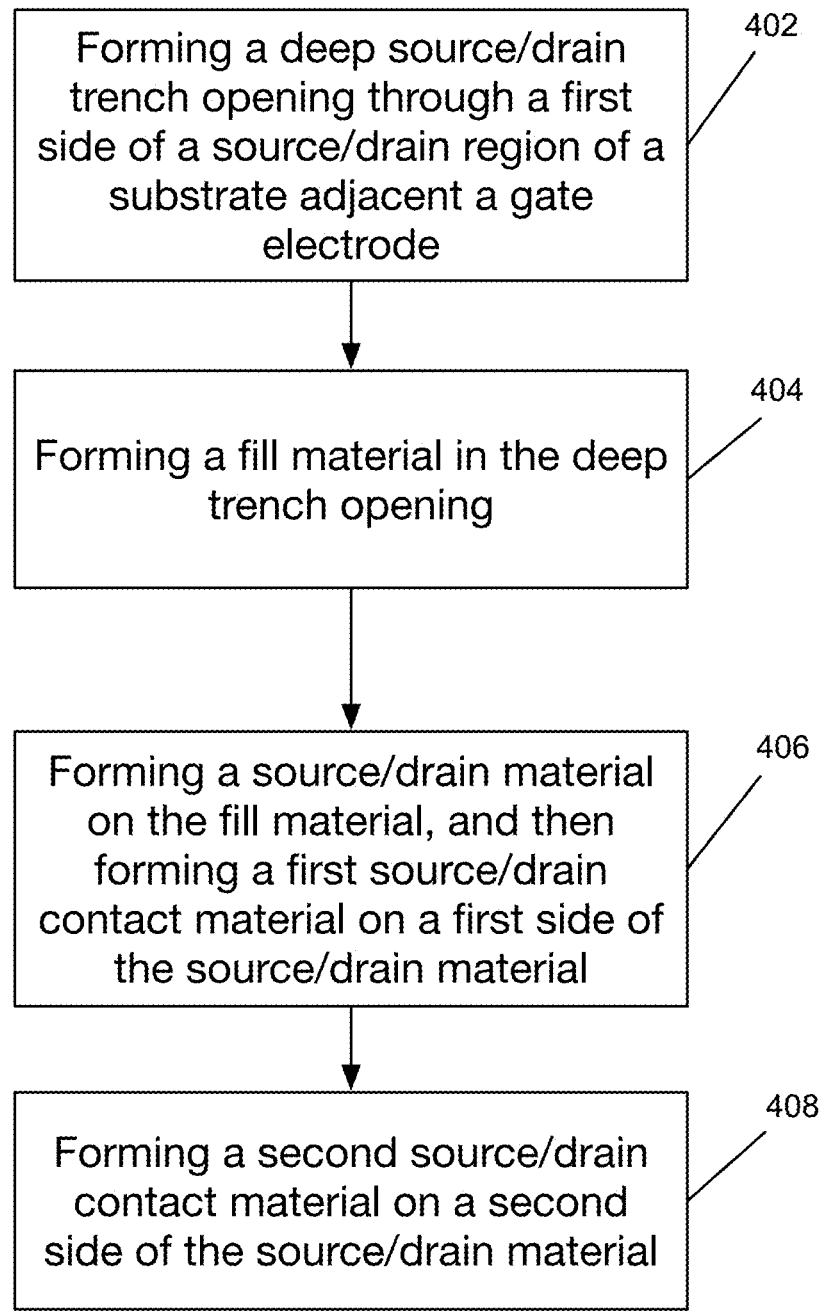
FIG. 4 represents a flow chart of a method according to embodiments.

FIG. 4 depicts a method according to embodiments herein. At step 402, a deep source/drain trench opening may be formed through a source/drain region of a substrate adjacent a gate electrode. At step 404, a fill material may be formed in the deep trench opening. At step 406, a source/drain material may be formed on the fill material, and then a first source/drain contact material may be formed on a first side of the source/drain material. At step 408, a second source/drain contact material may be formed on a second side of the source/drain material.

In an embodiment, the structures of the embodiments herein may be coupled with any suitable type of structures capable of providing electrical communications between a microelectronic device, such as a die, disposed in package structures, and a next-level component to which the package structures may be coupled (e.g., a circuit board).

The device structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. The structures/devices described in the various figures herein may comprise portions of a silicon logic die or a memory die, for example, or any type of suitable microelectronic device/die. In some embodiments the devices may further comprise a plurality of dies, which may be stacked upon one another, depending upon the particular embodiment. In an embodiment, the die(s) may be partially or fully embedded in a package structure.

The various embodiments of the device structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra mobilePC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 5:
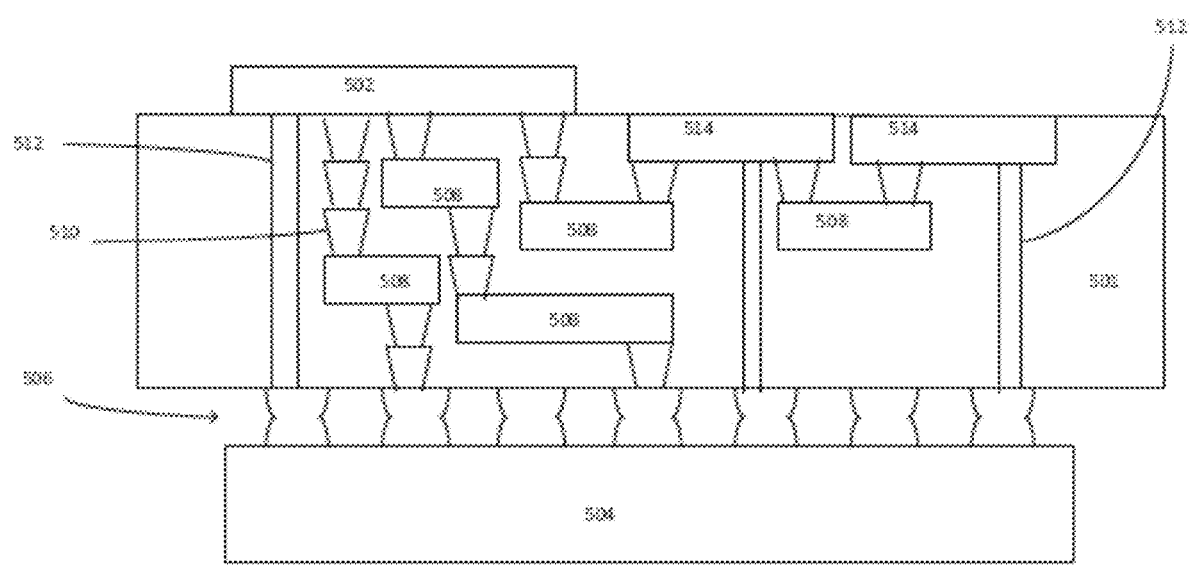
FIG. 5 represents an interposer implementing one or more embodiments.

FIG. 5 illustrates a device 500 that includes one or more embodiments of the invention. The device 500 may include interposer 501, which may comprise an intervening substrate used to bridge a first substrate 502 to a second substrate 504. The first substrate 402 may be, for instance, an integrated circuit die, and may or may not include embodiments of the self-aligned via described structures herein. The second substrate 504 may be, for instance, a memory module, a computer motherboard, or another integrated circuit die, and may or may not include embodiments of the self-aligned via described structures herein. Generally, the purpose of an interposer 501 is to spread a connection to a wider pitch or to reroute a connection to a different connection.

For example, an interposer 501 may couple an integrated circuit die to a ball grid array (BGA) 506 that can subsequently be coupled to the second substrate 504. In some embodiments, the first and second substrates 502/504 are attached to opposing sides of the interposer 501. In other embodiments, the first and second substrates 502/504 are attached to the same side of the interposer 501. And in further embodiments, three or more substrates are interconnected by way of the interposer 501.

The interposer 501 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials. The interposer may include metal interconnects 508 and vias 510, including but not limited to through-silicon vias (TSVs) 512. The interposer 501 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 501. In accordance with embodiments, apparatuses or processes disclosed herein may be used in the fabrication of interposer 501.

Figure 6:
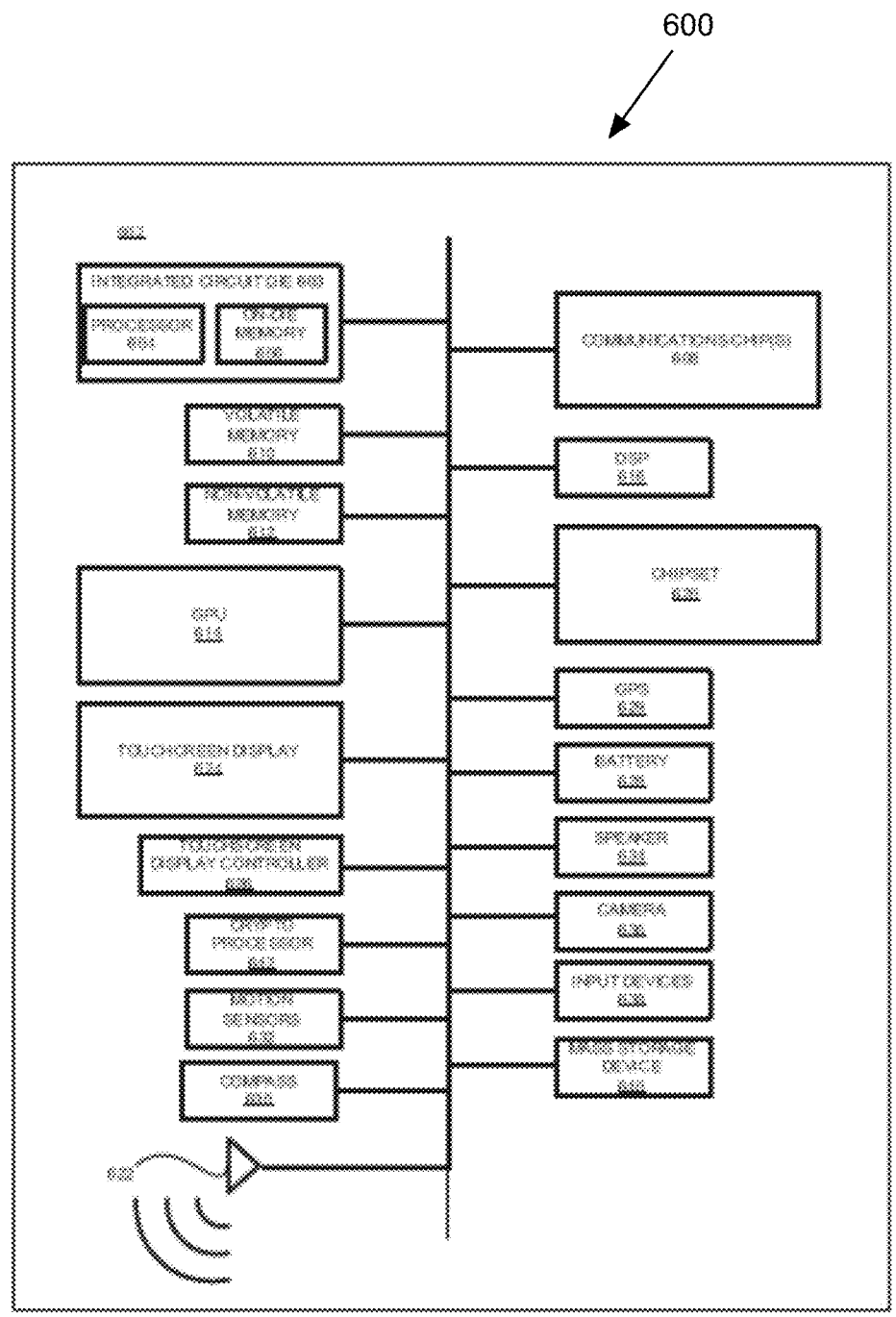
FIG. 6 represents a schematic of a system according to embodiments.

FIG. 6 is a schematic of a computing device 600 according to an embodiment. In an embodiment, the computing device 600 houses a board 602, such as a motherboard 602 for example. The board 602 may include a number of components, including but not limited to a processor 604, and an on-die memory 606, that may be communicatively coupled with an integrated circuit die 603, and at least one communication chip 608. The processor 604 may be physically and electrically coupled to the board 602. In some implementations the at least one communication chip 608 may be physically and electrically coupled to the board 602. In further implementations, the communication chip 606 is part of the processor 604.

Depending on its applications, computing device 600 may include other components that may or may not be physically and electrically coupled to the board 602, and may or may not be communicatively coupled to each other. These other components include, but are not limited to, volatile memory (e.g., DRAM) 610, non-volatile memory (e.g., ROM) 612, flash memory (not shown), a graphics processor unit (GPU) 614, a digital signal processor (DSP) 616, a crypto processor 642, a chipset 620, an antenna 622, a display 624 such as a touchscreen display, a touchscreen controller 626, a battery 628, an audio codec (not shown), a video codec (not shown), a global positioning system (GPS) device 629, a compass 630, accelerometer, a gyroscope and other inertial sensors 632, a speaker 634, a camera 636, and a mass storage device (such as hard disk drive, or solid state drive) 640, compact disk (CD) (not shown), digital versatile disk (DVD) (not shown), and so forth). These components may be connected to the system board 602, mounted to the system board, or combined with any of the other components.

The communication chip 608 enables wireless and/or wired communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 608 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 600 may include a plurality of communication chips 608. For instance, a first communication chip 608 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 600 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A microelectronic device structure, comprising:
    a fin of monocrystalline semiconductor material over a dielectric material
    a gate electrode adjacent to the fin;
    a drain region adjacent to the fin;
    a first contact to the drain region, the first contact adjacent to the gate electrode;
    a source region adjacent to the fin, and opposite the drain region;
    a second contact to the source region, the second contact adjacent to the gate electrode; and
    a third contact adjacent to the dielectric material, and in contact with the source region or the drain region, wherein the third contact is opposite the first contact or the second contact.

2. The microelectronic device structure of claim 1, wherein:
the third contact is separated from the first or second contact by only the source region or drain region.

3. The microelectronic device structure of claim 1, wherein
the fin comprises silicon and the source region and the drain region both comprise at least one of silicon and germanium.

4. The microelectronic device structure of claim 1, wherein the third contact comprises at least one of copper, tungsten, cobalt, or titanium.

5. The microelectronic device structure of claim 1, further comprising first interconnects coupled to the first and second contact, and second interconnects coupled to the third contact, wherein the first interconnects are over the fin and the second interconnects are under the fin.

6. A system comprising:
circuitry comprising the microelectronic device structure of claim 1; and
a DRAM communicatively coupled to circuitry.

7. The microelectronic device structure of claim 1, wherein:
the first contact and the second contact are separated from the gate electrode by an intervening spacer dielectric material; and
the third contact has a first length from the dielectric material that is substantially equal to a first length of the first or second contact from the dielectric spacer material.

8. The microelectronic device structure of claim 7, wherein:
the source region and drain region have a second length, orthogonal to, but in the plane of, the first length that exceeds a transverse width of the fin; and
the third contact also has a second length that exceeds the transverse width of the fin.

9. A microelectronic device structure, comprising:
a first transistor, comprising:
a first fin of monocrystalline semiconductor material, the first fin over a dielectric material
a first gate electrode adjacent to a sidewall of the first fin;
a first source/drain region adjacent to the first fin;
a first contact to the first source/drain region, the first contact adjacent to the first gate electrode;
a second source/drain region adjacent to the first fin;
a second contact to the second source/drain region, the second contact adjacent to the first gate electrode; and
a third contact adjacent to the dielectric material, and in contact with the first source/drain region, opposite the first source/drain region; and
a second transistor, comprising:
a second fin of the monocrystalline semiconductor material, the second fin over the dielectric material;
a second gate electrode adjacent to the second fin;
a third source/drain region adjacent to the fin;
a fourth contact to the third source/drain region, the fourth contact adjacent to the second gate electrode;
a fourth source/drain region adjacent to the fin;
a fifth contact to the fourth source/drain region, the fifth contact adjacent to the second gate electrode; and
a sixth contact adjacent to the dielectric material, and in contact with the fourth source/drain region, opposite the fourth source/drain region, wherein the third contact is separated from the sixth contact by the dielectric material.

10. The microelectronic device structure of claim 9, wherein:
the third contact is in contact with the dielectric material, and is separated from the first contact by only the first source/drain region; and
the sixth contact is in contact with the dielectric material, and is separated from the fifth contact by only the fourth source/drain region.

11. The microelectronic device structure of claim 9, wherein
the first and second fin comprises silicon and the source region and the drain region both comprise at least one of silicon and germanium.

12. The microelectronic device structure of claim 9, wherein the third contact and the sixth contact both comprise at least one of copper, tungsten, cobalt, or titanium.

13. The microelectronic device structure of claim 9, further comprising:
first interconnects coupled to the first, second, fourth and fifth contacts, wherein the first interconnects are over the first and second fins; and
second interconnects coupled to the third and sixth contacts, wherein the second interconnects are under the first and second fins.

14. The microelectronic structure of claim 9, wherein:
a first vertical height of the first, second, fourth and fifth contacts is substantially the same;
a second vertical height of the third and sixth contacts is substantially the same; and
the second vertical height is less than the first vertical height.

15. The microelectronic structure of claim 14, wherein the first vertical height is at least twice the second vertical height.

16. A method of forming a microelectronic structure, the method comprising:
forming a gate electrode over a sidewall of a fin, the fin comprising a monocrystalline semiconductor material;
forming a trench adjacent to the gate electrode to a depth below the gate electrode;
forming a first contact within the trench;
forming a source/drain region in contact with the fin and over the first contact;
forming a second contact to the source/drain region, the second contact opposite the first contact, and adjacent to the gate electrode.

17. The method of claim 16, further comprising forming a first interconnect layer coupled to the first contact, and forming a second interconnect layer coupled to the second contact.

18. The method of claim 16, wherein forming the source/drain region further comprises epitaxially growing a material comprising at least one of silicon or germanium after forming the first contact.

19. The method of claim 16, wherein forming the first contact comprises at least partially backfilling the trench with a conductive material comprising a metal.

20. The method of claim 19, wherein the metal comprises at least one of copper, tungsten, cobalt, or titanium.

* * * * *